United States Patent
Kim

(10) Patent No.: US 8,324,010 B2
(45) Date of Patent: Dec. 4, 2012

(54) LIGHT PIPE ETCH CONTROL FOR CMOS FABRICATION

(75) Inventor: Kihong Kim, Irvine, CA (US)

(73) Assignee: Himax Imaging, Inc., Grand Cayman (KY)

( * ) Notice: Subject to any disclaimer, the term of this patent is extended or adjusted under 35 U.S.C. 154(b) by 151 days.

(21) Appl. No.: 12/826,655

(22) Filed: Jun. 29, 2010

(65) Prior Publication Data

US 2011/0316106 A1 Dec. 29, 2011

(51) Int. Cl.
*H01L 31/18* (2006.01)
(52) U.S. Cl. ............... 438/69; 438/48; 438/52; 438/72; 438/E31.127
(58) Field of Classification Search .............. 438/48, 438/52, 63–66; 257/292–296, 432–433
See application file for complete search history.

(56) References Cited

U.S. PATENT DOCUMENTS

| 2007/0187787 A1 | 8/2007 | Ackerson et al. |
| 2009/0090989 A1* | 4/2009 | Han ............................ 257/432 |
| 2009/0159944 A1* | 6/2009 | Oh .............................. 257/292 |

* cited by examiner

*Primary Examiner* — Dung A. Le
(74) *Attorney, Agent, or Firm* — SU IP Consulting

(57) ABSTRACT

In accordance with at least some embodiments of the present disclosure, a process for fabricating a light pipe (LP) is described. The process may be configured to construct a semiconductor structure having an etch-stop layer above a photodiode region and a first dielectric layer above the etch-stop layer. The process may be configured to etch a LP funnel through the first dielectric layer. And the process may be further configured to stop the etching of the LP funnel upon reaching and removing of the etch-stop layer.

15 Claims, 4 Drawing Sheets

LIGHT PIPE ETCH CONTROL FOR CMOS FABRICATION

BACKGROUND OF THE DISCLOSURE

1. Field of the Disclosure

Embodiments of the present disclosure relate generally to complementary metal-oxide-semiconductor (CMOS) fabrication and more specifically to the fabricating of a light pipe for a CMOS image sensor.

2. Description of the Related Art

Unless otherwise indicated herein, the approaches described in this section are not prior art to the claims in this application and are not admitted to be prior art by inclusion in this section.

Image sensors have great usages in many fields. CMOS image sensors generally consume less power and also cost less than charge-coupled devices (CCD) image sensors. As the resolution of a CMOS image sensor increases, the size of each pixel sensor in the image sensor shrinks, which may also lead to the decreasing of the size of the photosensitive element (e.g., photodiode) in each pixel sensor. As the CMOS image sensors become increasingly more sophisticated, the requirements of pixel sensitivity and angular response for each pixel sensor also increase due to increasing aspect ratio of stack height to pixel pitch.

One of the methods to improve light sensitivity and angular response of the pixel sensor is to implement a light pipe (LP) on top of the photodiode. However, conventional LP fabrication processes often lead to depth fluctuations and size variations for the LPs in the CMOS sensor. The LPs built by these conventional fabrication processes may lead to low quality pixel sensors having poor light sensitivity and poor angular response.

DETAILED DESCRIPTION

Figure 1:
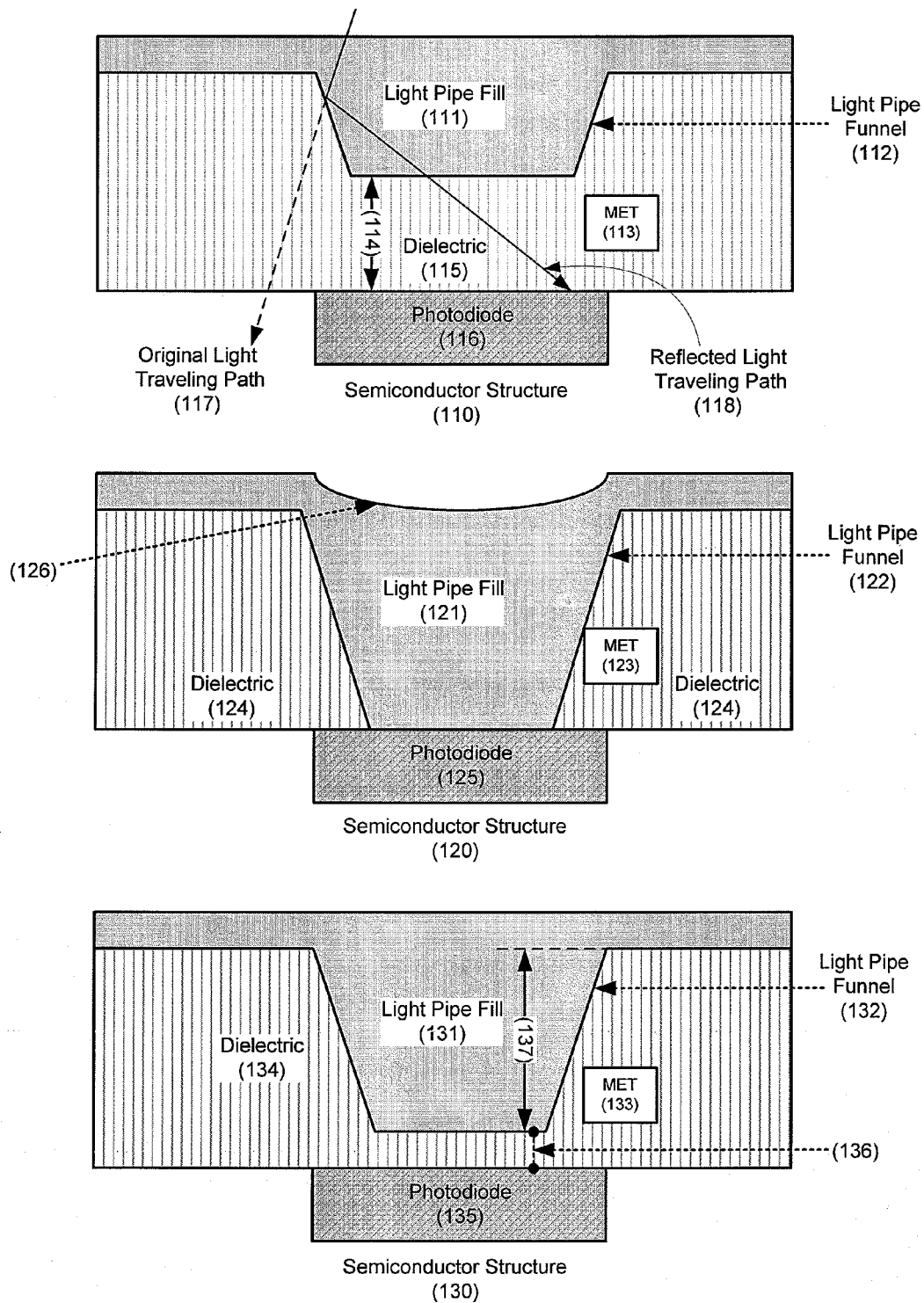
FIG. 1 shows multiple cross-section views of semiconductor structures generated by various LP fabrication processes.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated herein.

This disclosure is drawn, inter alia, to methods and semiconductor structures related to the fabricating of a LP on a semiconductor substrate. Throughout the disclosure, the term "light pipe" may broadly refer to a semiconductor structure above a photodiode in a pixel sensor. As a part of a pixel sensor, the LP and the photodiode may greatly increase the light sensitivity and angle response of the pixel sensor. The light pipe, or LP, may be formed by a LP funnel and LP fill material. The LP funnel may broadly refer to the sidewalls and bottom of a cylinder-shaped "well". The empty space within the "well", which is surrounded by the sidewalls and the bottom of the LP funnel, may be referred to as the "LP cavity." The LP cavity may then be filled with LP fill material that allows light photons to pass through. Some example requirements for such LP fill material may include, without limitation, high optical transmission, high refractive index, or easiness for gap fill. During operation, light photons may be "guided" down through the LP funnel to the bottom of the LP funnel, before reaching the photodiode.

In some embodiments, a "desired LP" for a pixel sensor may be fabricated to ensure the pixel sensor having desired light sensitivity and dark performance. The desired LP may have a desired height for better angle response. Further, the desired LP may have a dielectric layer between its bottom and the photodiode below. The dielectric layer may have a desired thickness, so that the photodiode may have better dark performance. The details about the desired height and thickness are further described below.

Throughout the disclosure, the term "semiconductor structure" may broadly refer to a physical structure constructed based on a semiconductor fabrication process. For example, a fabrication process may be a multiple-step sequence of photographic and chemical processing. During the fabrication process, different electronic components are gradually created on a semiconductor wafer using various depositions and etching operations. The fabrication process may deposit a layer of material on top of other materials, or etch away material from the semiconductor structure. Throughout the disclosure, when a first layer of material is deposited "above" a second layer of material, the first layer of material may either be directly on the top of the second layer, or there might be additional material in between the first and the second layers. In other words, after the second layer of material is fabricated, additional material may be deposited on the top of the second layer before the first layer of material being deposited.

FIG. 1 shows multiple cross-section views of semiconductor structures generated by various LP fabrication processes. In FIG. 1, semiconductor structures 110, 120, and 130 may be the results of these LP fabrication processes. The semiconductor structure 110 shows an example LP having a shallow funnel, which may have poor light sensitivity and poor angle response. The semiconductor structure 120 shows another example LP having a deep funnel, which may have poor dark performance. The semiconductor structure 130 shows an example desired LP.

To construct the semiconductor structure 110, a photodiode region 116 may first be deposited on a semiconductor substrate (not shown in FIG. 1). Afterward, one or more dielectric layers 115 may be deposited above the photodiode region 116. In some embodiments, one or more metal lines 113 may be formed above or in between the dielectric layers 115, and other dielectric layers 115 may be formed above the metal line 113. After the dielectric layers 115 are deposited to a desired thickness, the semiconductor structure 110 may be ready for fabricating a LP funnel 112.

In some embodiments, the LP funnel 112 may be etched on the dielectric layers 115 during an etching process. The etching process may remove the material in the dielectric layers 115, so that a cylinder-shaped cavity may be formed in the semiconductor structure 110. The cross-section view of this cylinder-shaped cavity is shown as the LP funnel 112. After the LP funnel 112 is formed, additional LP fill 111 may be deposited to fill up the cavity created by the LP etching process. In some embodiments, the semiconductor structure formed by the cavity and the sidewalls of the LP funnel 112 as well as the LP fill 111 may be deemed a LP. The result of the aforementioned LP fabrication process may be the semiconductor structures 110, 120, or 130.

In some embodiments, the photodiode region 116 may generate an electrical signal when a light photon directly strikes its surface. For example, the light photon may pass through the LP fill 111 and the dielectric layer 115 and hit the photodiode region 116. On the other hand, when a light photon travels toward the semiconductor structure 110 at an angle and along an original light photon traveling path 117, the light photo may miss the photodiode region 116. With the LP funnel 112, however, the light photon passing through the LP fill 111 along the original light traveling path 117 may instead hit the sidewall of the LP funnel 112, and the sidewall of LP funnel 112 may reflect the light photon along a reflected light traveling path 118 and "guide" the light photon toward the photodiode region 116. This allows the photodiode region 116 to sense the light photon that may not initially travel toward the photodiode region 116. As has been shown, the LP may greatly improve the light sensitivity and angular response of the photodiode region 116.

In some embodiments, it may be hard to control the LP etching process during the LP fabrication process. In other words, the LP fabrication process may stop the etching of the LP funnel 112 prematurely, resulting in the LP funnel 112 that may be too shallow and the dielectric layer 115 having an undesired thickness 114 (e.g., thicker than approximately 1.3 micrometer (um)). In this case, the shallow LP funnel 112 may have a shorter sidewall and narrower opening comparing to a normal LP funnel. As a result, the shallow LP funnel 112 may collect and reflect fewer light photons to the photodiode region 116.

Before the light funnel 122 is etched, the semiconductor structure 120 may be similarly prepared as the semiconductor structure 110. In some embodiments, as illustrated by the semiconductor structure 120, the LP fabrication process may remove too much dielectric material from the dielectric layer 124, and leave very thin (e.g., thinner than approximately 0.3 um) or no dielectric layer above the photodiode region 125. In this case, the photodiode region 125 may have good light sensitivity, since the light funnel 122 may have longer sidewalls and wider opening, allowing more light photons to be guided toward the photodiode region 125. However, such an approach may expose the photodiode region 125 to the etching process. As a result, the photodiode region may be damaged. Further, having a LP too close to the photodiode surface may lead to hot pixel or dark current.

Another issue related to a deep LP funnel is that the subsequent LP cavity fill operation may cause an uneven LP top surface (126). The LP cavity fill operation may assume the depth of the LP funnel to be a certain level. When the LP funnel 122 is deeper than the assumed depth, the amount of LP fill material 121 may become insufficient. As a result, there may be less LP fill material 121, leaving an uneven surface on the top of the LP fill 121. In addition, a deep etch may lead to a wider LP funnel 122. In this case, a metal line 123, which should be surrounded by the dielectric layer 124, may be "exposed" in the LP funnel 122 by touching or breaking the sidewall of the LP funnel 122. As a result, the affected sidewall of the LP funnel 122 may have poor light reflection. The exposing of the metal line 123 may also cause the semiconductor structure 120 to malfunction.

In some embodiments, as illustrated by the semiconductor structure 130, the LP fabrication process may generate a desired LP funnel 132, which has a good light sensitivity and angular response, as well as limited photodiode damages and good dark performance. The desired LP funnel 132 may have a sufficient height 137, which corresponds to a sufficient LP sidewall length and a desired-sized LP opening. In addition, there may be a dielectric layer 134 having a desired thickness 136 at the bottom of the LP funnel 132 and above a photodiode region 135. Further, there is no uneven surface caused by having insufficient amount of LP fill material 131 at the top of the semiconductor structure 130, and the metal line 133 may be well insulated by the dielectric layer 134.

Figure 2:
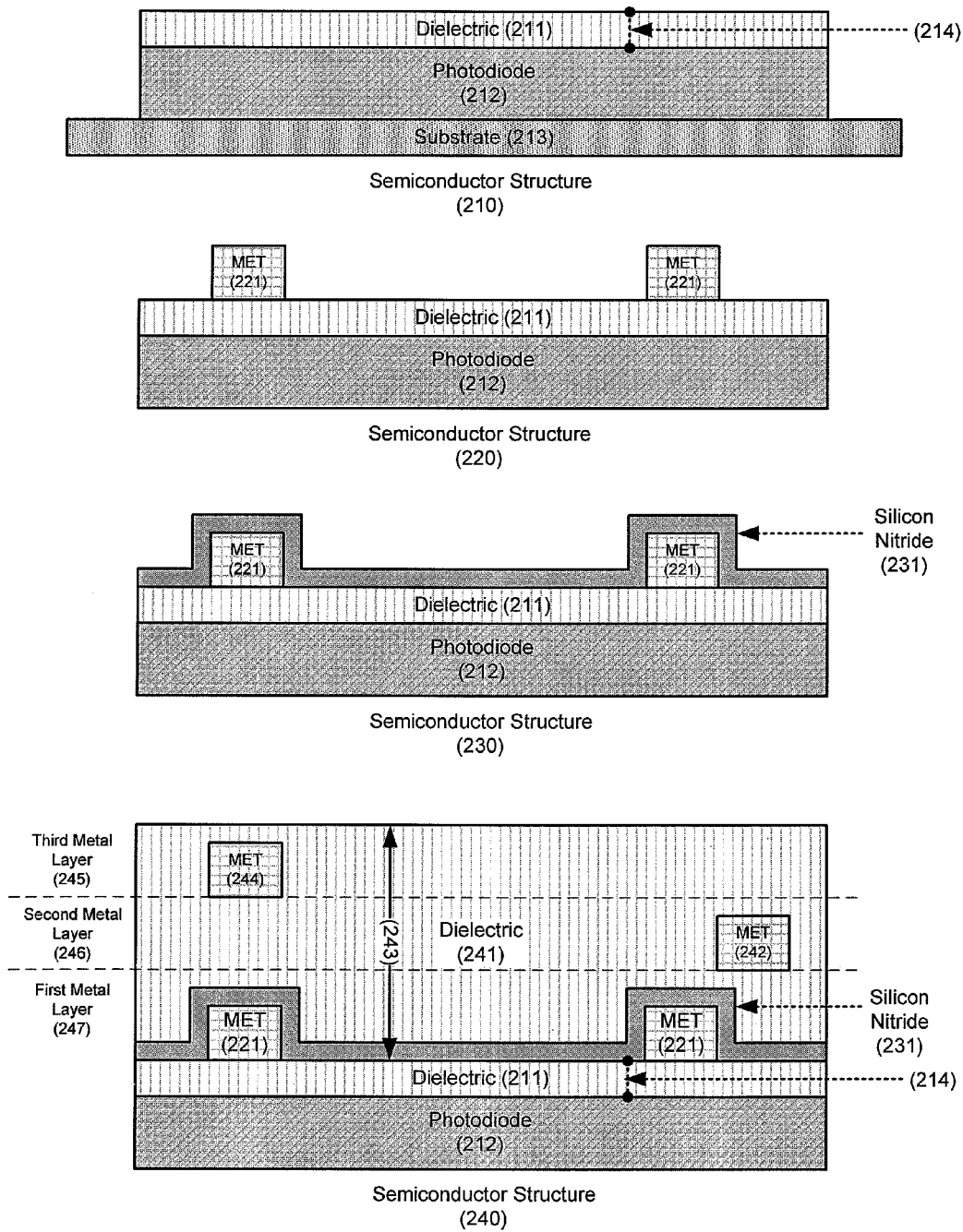
FIG. 2 shows multiple cross-section views of semiconductor structures going through a LP fabrication process.

FIG. 2 shows multiple cross-section views of semiconductor structures going through a LP fabrication process, in accordance with illustrative embodiments of the present disclosure. In FIG. 2, a semiconductor structure 210 may be formed based on a set of fabrication steps. The semiconductor structure 210 may go through further depositing and etching fabrication steps to generate semiconductor structures 220, 230, and 240. In some embodiments, a photodiode region 212 may be formed on top of a semiconductor substrate 213. The semiconductor substrate 213 may be a part of a silicon wafer, which is formed using semiconductor materials such as silicon or germanium. The substrate 213 layer is not shown in the subsequent semiconductor structures 220, 230, and 240.

The photodiode region 212 may be deposited above the surface of the substrate 213 or be etched and formed below the surface of the substrate 213. Alternatively, the photodiode region 212 may be formed on or above other semiconductor structures. After the photodiode region 212 is formed, a dielectric layer 211 may be deposited above the photodiode region 212. In some embodiments, the dielectric layer may utilize electrically insulating materials such as inter-metal dielectric (IMD) or silicon oxide. A thickness 214 of the dielectric layer 211 may be controlled to conform to the thickness the dielectric layer at the bottom of a desired LP funnel, as illustrated by thickness 136 of FIG. 1.

In some embodiments, the thickness 214 may be adjusted during a dielectric deposition process by controlling the speed and also the amount of time spent in depositing the dielectric material above the photodiode region 212. After the dielectric deposition process, a chemical mechanical polishing (CMP) may be applied to the surface of the dielectric layer 211 to reduce the thickness 214 to the desired measurement. In some embodiments, the desired thickness 214 may be between approximately 0.3 um to approximately 1.3 um for the semiconductor structure 210 to provide desired light sensitivity and dark performance. When the thickness 214 is reduced to approximately 0.3 um or lower, or approximately 1.3 um or higher, the semiconductor structure 210 may provide either good light sensitivity or good dark performance, but not both. In one example implementation, when the thickness 214 is at or around 0.6 um, regardless of the top structure above the dielectric layer 211, the pixel sensor subsequently constructed may have a desired combination of light sensitivity and dark performance.

Afterward, one or more metal lines 221 may be formed on the top of the dielectric layer 211 to generate the semiconductor structure 220. In some embodiments, the metal lines 221 may use copper, aluminium, or any other conductive metals. In the next step, a silicon nitride layer 231 may be formed on the top of the dielectric layer 211 and the metal lines 221. The silicon nitride layer 231 may be formed using chemical vapour deposition techniques. The result of this step may be illustrated by the semiconductor structure 230. In some embodiments, the silicon nitride layer 231 may be used as an etch-stop layer for subsequent etching processes. Alternatively, other types of materials, such as oxy nitride, may be used to construct the etch-stop layer. Further, other material may also be used for the etch-stop layer as long as such material has etching selectivity comparing to the materials used in the dielectric layers 211 and/or 241. Etching selectivity may refer to the detecting of a first material when etching the second material. The etching of the second material does not affect the first material. The silicon nitride layer 231 may also serve as a protection layer for the metal line 221. In other words, the silicon nitride layer 231, which covers the top and the sides of the metal line 221, may prevent excessive etching that could expose or damage the metal line 221.

In some embodiments, one or more dielectric layers 241, and/or one or more metal lines 242 may be formed above the dielectric layer 211. As illustrated by the semiconductor structure 240, a first metal layer 247 may be formed on the top of the dielectric layer 211. Such a semiconductor structure 240 may be referred to as a one-metal pixel structure if there are no additional metal lines above the first metal layer 247. This first metal layer 247 may then be polished to form a flat surface, on which the metal line 242 may be formed. Subsequently, another layer of dielectric material may be deposited to cover the metal line 242, and an additional polishing process may ensure that the semiconductor structure 240 has a flat top surface. The semiconductor structure 240 that has the first metal layer 247 and the second metal layer 246 (without the third metal layer 245) may be referred to as a two-metal pixel structure, since there are two layers of metal lines (e.g., the metal lines 221 and the metal line 242) in the semiconductor structure 240. Further, additional metal lines (e.g., a metal line 244) may be formed as a part of the third metal layer 245 above the second metal layer 246 to form three-or-more-metal pixel structure.

In some embodiments, chemical and mechanical polishing process may adjust the height (243) of the multiple dielectric layers 241 and the silicon nitride layer 231 to a measurement that may be sufficient for the subsequent constructing of a desired LP, as illustrated by the sufficient height 137 of FIG. 1. For an example two-metal pixel structure, the sufficient height 243 may be between approximately 0.5 um to approximately 1.5 um. In one example implementation, when the height 243 is at or around 1.2 um, the pixel sensor subsequently constructed may have a desired light sensitivity and angular response. For an example three-metal pixel structure, the sufficient height 243 may be between approximately 1.5 um to approximately 2.2 um, and a desired height measurement may be at or around 2.2 um.

In some embodiments, a desired LP in a semiconductor structure, such as the semiconductor structure 240, may have the height 243 to be approximately 2-4 times the thickness 214.

Figure 3:
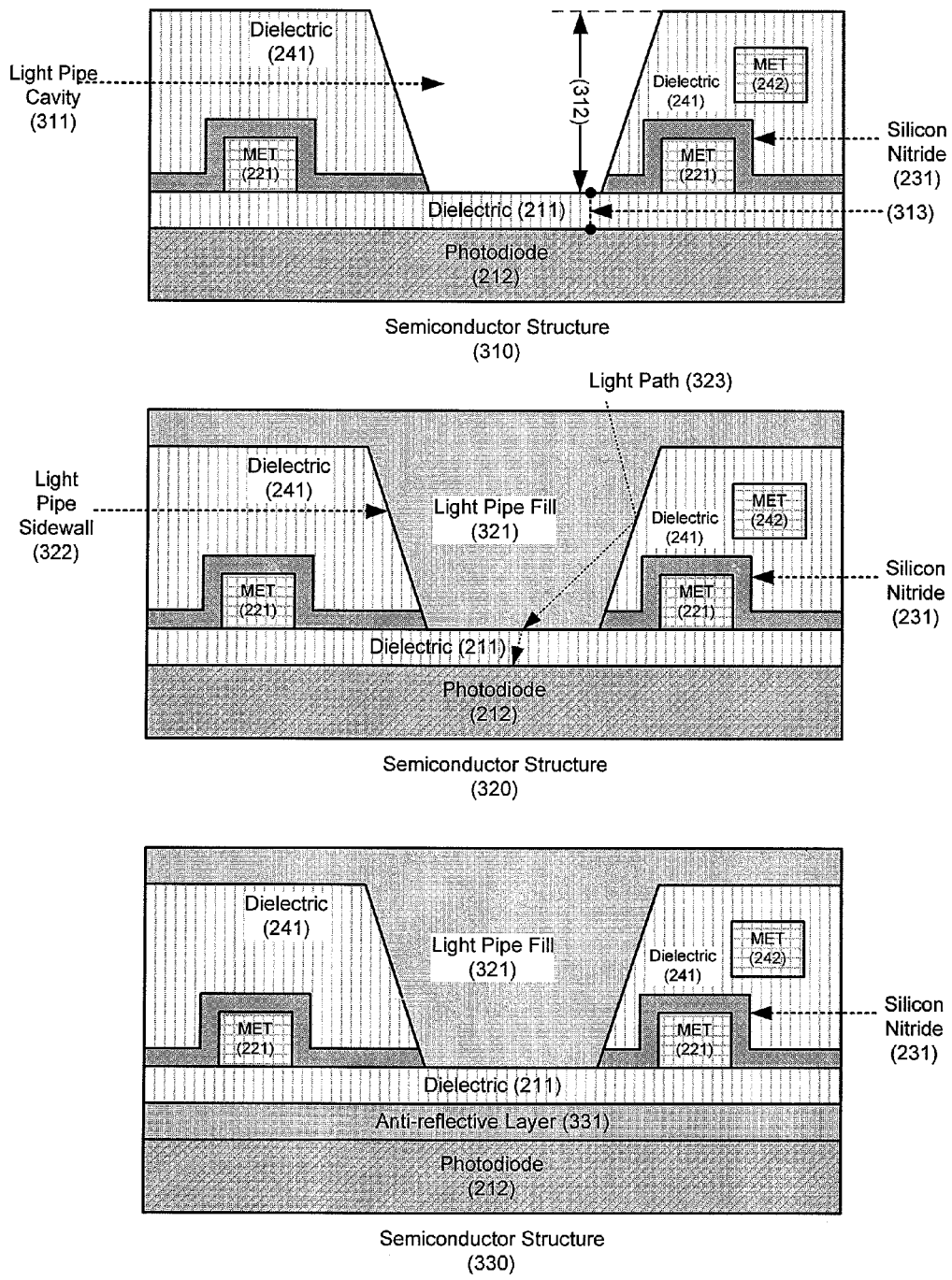
FIG. 3 shows multiple cross-section views of semiconductor structures continuing through the LP fabrication process.

FIG. 3 shows multiple cross-section views of semiconductor structures continuing through the LP fabrication process, in accordance with illustrative embodiments of the present disclosure. The semiconductor structures 310, 320, and 330 may be built based on a two-metal pixel structure constructed via the process illustrated in FIG. 2. In some embodiments, an etching process may remove some of the dielectric material from the dielectric layer 241. The etching process may utilize lithographic method to direct the etching operation toward a specific region on the dielectric layer 241. For example, when a wet etching method is used, additional photo-resist patterns (not shown in FIG. 3) may be formed above the dielectric layer 241 to act as blocking masks. If the etching process is anisotropic, meaning that the rates of etching away the materials are different for different directions, the outcome of the etching process may have pyramid-like slopes and edges, as illustrated by the LP cavity 311 of the semiconductor structure 310. In some embodiments, dry etching process may use plasma blasting to remove the dielectric material, and the resulted LP cavity 311 may have sidewalls that are more or less vertical. The dry etching process may direct energy to a confined area of the dielectric layer 241 and create pressure sufficient to remove the dielectric material and produce the LP cavity 311.

In some embodiments, the above etching process may be controlled to ensure that it stops further etching deeper into the semiconductor structure 310 once the silicon nitride layer 231 is removed. The silicon nitride layer 231, which may be served as an etch-stop layer, may allow the dielectric material 241 above the silicon nitride layer 231 to be completely removed. As soon as the etching process reaches the silicon nitride layer 231, it may be stopped once the silicon nitride layer 231 is removed, thereby preserving the dielectric layer 211 that is below the silicon nitride layer 231.

In some embodiments, when the dielectric layer 241 uses silicon oxide, the etching process may be tuned to selectively etch silicon oxide, but not silicon nitride. Thus, when the etching process reaches the silicon nitride layer 231, the etching equipment may detect the presence of the silicon nitride that has different chemical characteristics than the silicon oxide, and may stop the further etching of the silicon oxide. Subsequently, the etching equipment may switch to an etching gas that may selectively etch silicon nitride or oxy nitride, but not silicon oxide. Again, once the etching equipment detects silicon oxide, it means the silicon nitride layer 231 may be removed, and the dielectric layer 211 may be reached. The etching process may be stop, so that no material from the dielectric layer 211 may be affected. Thus, after the etching process is completed, the resulting LP cavity 311 may have a sufficient height 312 that would provide good angular response and light sensitivity. Also, the thickness 313 of the remaining dielectric layer 211 may lead to a LP with a safe bottom distance away from the photodiode region 212. Further, the sufficient dielectric layer 211 may provide good dark performance by reducing dark current, and minimize the hot pixel damages that are introduced during the etching process.

In some embodiments, the layer of silicon nitride 231 may provide a protection layer surrounding the metal line 221. That is, the silicon nitride 231 may serve as an etch-stop layer to prevent the etching process from affecting the metal line 221. As a result, the metal lines 221 would not be exposed near the LP cavity 311 due to excessive etching.

In the next fabrication step, a filling material may be used to fill the LP cavity 311 and form a LP fill 321. In some embodiments, the filling material may be a transparent material, allowing light photons to pass through and strike the photodiode region 212. In some embodiments, the filling material may be silicate glass. Once filled, the LP fill 321 and the LP sidewall 322 may be deemed a LP funnel. The LP funnel and the photodiode region 212 may be used as a part of a pixel sensor for a CMOS sensor.

To achieve the desired performance, the filling material may have a refractive index that is higher than the refractive index of the dielectric layer 241. When a light photon travels from a first medium to a second medium and hit the medium boundary, the higher the refractive index of the first medium comparing to the second medium, the lower the angle for the light photon to be reflected at the medium boundary. Thus, when a light photon travels (323) toward the light pipe sidewall 322, due to the difference in the refractive indexes between the LP fill 321 and the dielectric material 241, the light photon may be reflected off the light pipe sidewall 322, and arrive at the photodiode region 212. In other words, the greater the differences between the refractive indices of the two materials (LP fill 321 and dielectric 241), the more photons may be reflected off the light pipe sidewall 322 and be directed toward the photodiode region 212.

In some embodiments, the material used for forming the dielectric layer 211 may be selected based on its refractive index in comparison to the refraction index of the LP fill 321, in order to ensure more photons arriving at the dielectric layer 211 to be refracted into the dielectric layer 211, rather than being reflected back at the boundary between the LP fill 321 and the dielectric layer 211. Thus, the light photons collected by the LP funnel may be able to pass through the dielectric layer 211 and arrive at the photodiode region 212.

In some embodiments, additional layers may be deposited above the photodiode region 212 to server different purposes. As illustrated by the semiconductor structure 330, an anti-reflective layer 331 may be deposited below the dielectric layer 211 and above the photodiode region 212 during early fabrication process. In other embodiments, the silicon nitride layer 231 may be deposited before the metal line 221. In this case, the silicon nitride layer 231 may still server its etch-stopping purpose. However, the silicon nitride layer 231 may not be able to protect the metal line 221 during etching process and ensure that the metal line 221 may not be exposed to the LP cavity 311.

Figure 4:
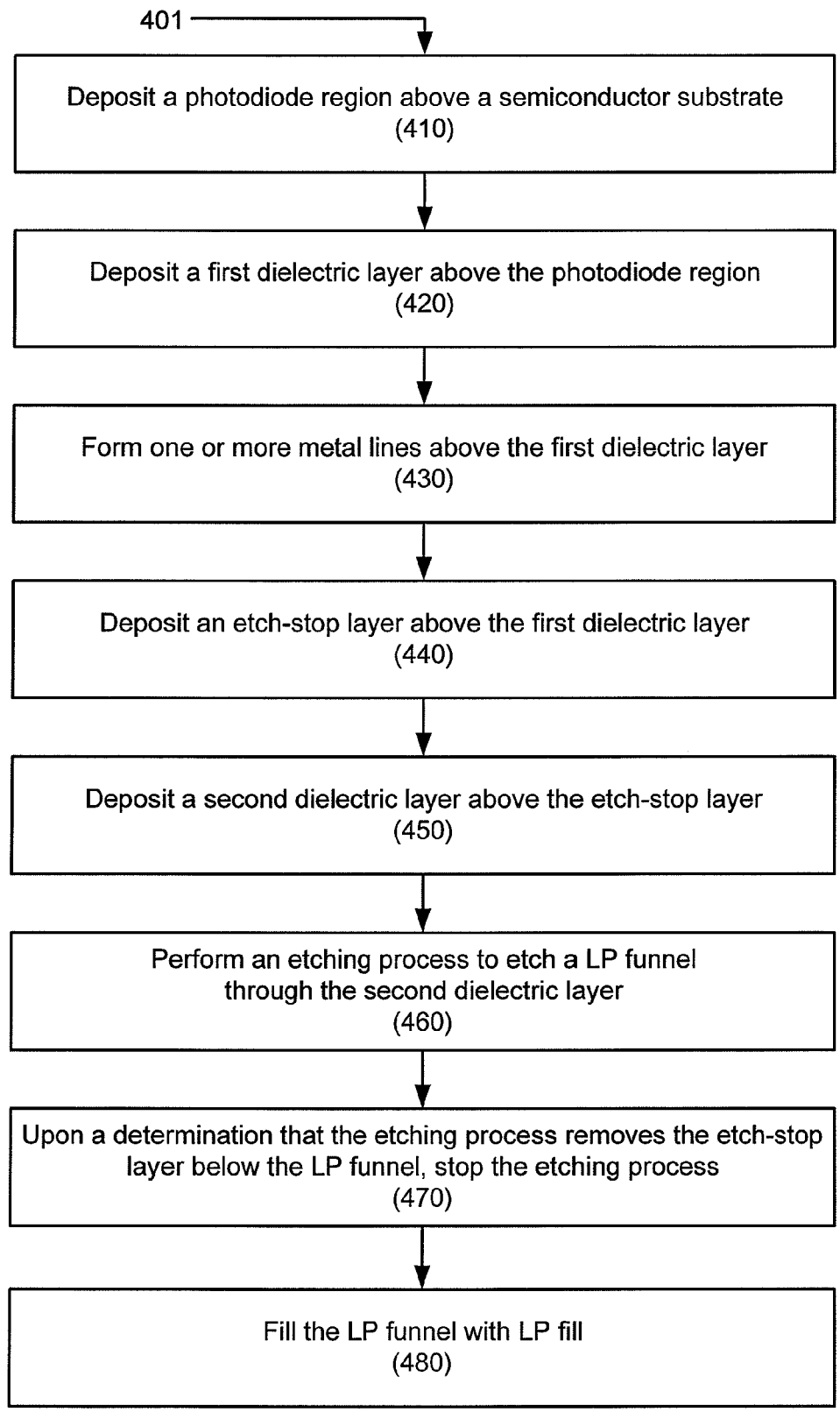
FIG. 4 shows a flow diagram of an illustrative embodiment of a process for fabricating a LP on a semiconductor substrate.

FIG. 4 shows a flow diagram of an illustrative embodiment of a process 401 for fabricating a desired LP on a semiconductor substrate. The process 401 sets forth various functional blocks or actions that may be described as processing steps, functional operations, events, and/or acts, which may be performed by hardware, software, and/or firmware. Those skilled in the art in light of the present disclosure will recognize that numerous alternatives to the functional blocks shown in FIG. 4 may be practiced in various implementations.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. Moreover, one or more of the outlined steps and operations may be performed in parallel.

At block 410, a photodiode region may be deposited above a semiconductor substrate. The photodiode region may become a part of a pixel sensor for a CMOS image sensor. At block 420, a first dielectric layer may be deposited above the photodiode region. The fabrication process may control the depositing of the dielectric materials to ensure the first dielectric layer having a sufficient thickness. This sufficient thickness may allow the subsequently generated LP funnel to have a desired performance.

At block 430, one or more metal lines may be formed above the first dielectric layer. In some embodiments, this operation may be optional, as the metal lines are not the essential elements for the LP funnel. At block 440, an etch-stop layer may be deposited above the first dielectric layer. In some embodiments, the etch-stop layer may use silicon nitride as etch-stop material. The etch-stop layer may be deposited above the metal lines formed at block 430. In this case, the etch-stop layer may also stop the subsequent etching process from damaging the metal lines or exposing the metal lines in the LP funnel.

At block 450, a second dielectric layer may be deposited above the etch-stop layer. In some embodiments, the second dielectric layer may use similar or different material comparing to the first dielectric layer. For example, the first and the second dielectric layers may have different refraction indices. Further, additional dielectric layers and metal lines may be deposited above the etch-stop layer. Afterward, the second dielectric layer may be polished using chemical mechanical polishing techniques. In some embodiments, the second dielectric layer may have a height of a desired LP.

At block 460, an etching process may be performed to etch a LP funnel on the semiconductor structure built by the operations of the blocks 410-450. The etching process may utilize dry etching or web etching to remove the dielectric materials in the second dielectric layer. The etching process may generate a sloped or vertical sidewall for the LP funnel, leaving a LP cavity behind. At block 470, the etching process may determine that the dielectric materials above the etch-stop layer are removed, and upon the removal of the etch-stop layer at the bottom of the LP funnel, the etching process may be stopped. As a result, the first dielectric layer may be exposed, but not thinned by the etching process. Since the first dielectric layer may have a desired bottom thickness suitable for a desired LP, the exposed first dielectric layer may become the foundation for the subsequent construction of the desired LP.

At block 480, the LP funnel may be filled with specific type of LP fill. In some embodiments, the LP fill may utilize transparent materials that have high refraction indices. After further polishing to remove the excess LP fill material, the result may be a desired LP having desired light sensitivity and dark performance.

Thus, methods and systems for constructing a light pipe have been described. Although the present disclosure has been described with reference to specific exemplary embodiments, it will be recognized that the disclosure is not limited to the embodiments described, but can be practiced with modification and alteration within the spirit and scope of the appended claims. Accordingly, the specification and drawings are to be regarded in an illustrative sense rather than a restrictive sense.

I claim:

1. A method for fabricating a light pipe (LP), comprising:
constructing a semiconductor structure having an etch-stop layer above a photodiode region and a first dielectric layer above the etch-stop layer, wherein the etch-stop layer is made of a material with etching selectivity and is configured to prevent materials deposited below the etch-stop layer from being etched;
etching a LP funnel through the first dielectric layer; and
upon reaching and removing of the etch-stop layer, stopping the etching of the LP funnel.

2. The method as recited in claim 1, further comprising:
filling the LP funnel with LP fill material.

3. The method as recited in claim 1, wherein the constructing of the semiconductor structure further comprising:
depositing a second dielectric layer above the photodiode region and below the etch-stop layer, wherein the second dielectric layer has a thickness corresponding to a predetermined bottom thickness from the LP funnel to the photodiode region.

4. The method as recited in claim 3, wherein the constructing of the semiconductor structure further comprising:
depositing a metal line above the second dielectric layer and below the etch-stop layer, wherein the etch-stop layer covers the top and the sides of the metal line.

5. The method as recited in claim 1, wherein the etch-stop layer is formed using Silicon Nitride (SiN).

6. The method as recited in claim 1, wherein the first dielectric layer is formed using inter metal dielectric (IMD).

7. The method as recited in claim 1, wherein the etching of the LP funnel through the first dielectric layer utilizes a dry-etching process.

8. A method for fabricating a light pipe (LP), comprising:
depositing a photodiode region above a semiconductor substrate;
depositing a first dielectric layer above the photodiode region;
depositing an etch-stop layer above the first dielectric layer, wherein the etch-stop layer is made of a material with etching selectivity and is configured to prevent materials deposited below the etch-stop layer from being etched;
depositing a second dielectric layer above the etch-stop layer;
performing an etching process to etch a LP funnel through the second dielectric layer; and
upon a determination that the etching process removes a section of the etch-stop layer below the LP funnel, stopping the etching process.

9. The method as recited in claim 8, further comprising:
filling the LP funnel with LP fill material, wherein the LP fill material has a refraction index that is higher than a refraction index of the second dielectric layer.

10. The method as recited in claim 8, further comprising:
depositing an anti-reflective layer above the photodiode region, wherein the first dielectric layer is deposited above the anti-reflective layer.

11. The method as recited in claim 8, wherein the first dielectric layer has a thickness ranging from approximately 0.3 um to approximately 1.3 um.

12. The method as recited in claim 8, wherein the first dielectric layer has a thickness that is substantially equivalent to 0.6 um.

13. The method as recited in claim 8, wherein a height for the second dielectric layer and the etch-stop layer ranges from approximately 1.5 um to approximately 2.2 um.

14. The method as recited in claim 8, wherein a height for the second dielectric layer having two metal lines and the etch-stop layer is substantially equivalent to 1.2 um.

15. The method as recited in claim 8, wherein a height for the second dielectric layer having three metal lines and the etch-stop layer is substantially equivalent to 2.2 um.

* * * * *